United States Patent
Lee et al.

(10) Patent No.: US 7,352,239 B2
(45) Date of Patent: Apr. 1, 2008

(54) POWER AMPLIFICATION APPARATUS USING SWITCHING STRUCTURE IN A WIRELESS COMMUNICATION SYSTEM AND METHOD FOR CONTROLLING THE SAME

(75) Inventors: Jong-Sung Lee, Yongin-si (KR); Jin-Sung Kim, Seoul (KR)

(73) Assignee: Samsung Electronics Co., Ltd (KR)

( * ) Notice: Subject to any disclaimer, the term of this patent is extended or adjusted under 35 U.S.C. 154(b) by 166 days.

(21) Appl. No.: 11/297,483

(22) Filed: Dec. 8, 2005

(65) Prior Publication Data
US 2006/0119428 A1    Jun. 8, 2006

(30) Foreign Application Priority Data
Dec. 8, 2004    (KR) ............... 10-2004-0103235

(51) Int. Cl.
*H03F 3/68* (2006.01)

(52) U.S. Cl. ............... 330/124 R; 330/124 D; 330/51

(58) Field of Classification Search ............ 330/124 R, 330/51, 124 D
See application file for complete search history.

(56) References Cited

U.S. PATENT DOCUMENTS

| | | | | |
|---|---|---|---|---|
| 6,097,252 | A * | 8/2000 | Sigmon et al. | 330/136 |
| 6,445,247 | B1 * | 9/2002 | Walker | 330/10 |
| 6,492,867 | B2 * | 12/2002 | Bar-David | 330/10 |
| 6,853,244 | B2 * | 2/2005 | Robinson et al. | 330/51 |

* cited by examiner

*Primary Examiner*—Patricia Nguyen
(74) *Attorney, Agent, or Firm*—The Farrell Law Firm, PC

(57) ABSTRACT

A power amplification apparatus includes a carrier amplifier and a peaking amplifier. In the apparatus, a detection and comparison controller detects an envelope signal from an input signal, compares a value of the envelope signal with a threshold, and generates a control signal corresponding to a threshold power. At least one switch performs a switching operation for turning on/off the peaking amplifier according to the control signal.

20 Claims, 7 Drawing Sheets

POWER AMPLIFICATION APPARATUS USING SWITCHING STRUCTURE IN A WIRELESS COMMUNICATION SYSTEM AND METHOD FOR CONTROLLING THE SAME

PRIORITY

This application claims the benefit under 35 U.S.C. § 119(a) of an application entitled "Power Amplification Apparatus Using Switching Structure in a Wireless Communication System and Method for Controlling the Same" filed in the Korean Intellectual Property Office on Dec. 8, 2004 and assigned Serial No. 2004-103235, the entire contents of which are hereby incorporated by reference.

BACKGROUND OF THE INVENTION

1. Field of the Invention

The present invention relates generally to a power amplification apparatus applied to a wireless communication system, and in particular, to a Doherty amplifier obtained by improving gain and linearity of a power amplification apparatus for a base station.

2. Description of the Related Art

Generally, the only factor that has been considered important with respect to a base station (BS) in a wireless communication system is linearity. This is because a power amplification apparatus for a base station has sufficient power. Recently, however, because such factors as output improvement, miniaturization and operation cost reduction for the base station are regarded as important factors, research is now being conducted on improving efficiency of the power amplification apparatus.

A Doherty amplifier has been proposed to improve efficiency of the power amplification apparatus. Commonly, the Doherty amplifier has a structure in which a carrier amplifier is asymmetrically combined in parallel with a peaking amplifier.

The Doherty amplifier, a type of amplifier used for high-performance modulation in a high-power transmitter such as a base station, was first proposed by W. H. Doherty in 1936, and has a structure in which a carrier amplifier is connected in parallel to a peaking amplifier using a quarter-wave transformer (or λ/4 line). The peaking amplifier in the Doherty amplifier adjusts impedance of a load line of the carrier amplifier through a method of providing a varying amount of current to the load according to a power level, thereby increasing an efficiency characteristic of the Doherty amplifier.

FIG. 1 is a block diagram schematically illustrating a structure of a general Doherty amplifier used in a wireless communication system.

Referring to FIG. 1, the Doherty amplifier includes a divider 101, a carrier amplifier 103, a peaking amplifier 105, and transformers 107 and 109. The Doherty amplifier has a structure in which the carrier amplifier 103 is asymmetrically combined in parallel with the peaking amplifier 105.

In the Doherty amplifier, the peaking amplifier 105 performs a varying operation according to its input power. That is, for low input power, the peaking amplifier 105 does not perform amplification operation on the input power, and is turned OFF. However, for high input power, the peaking amplifier 105 performs amplification operation on the input power, and is turned ON. In other words, for the low input power, the carrier amplifier increases its gain such that the load seen at the carrier amplifier 103 is two times higher than that for the high input power, thereby showing higher efficiency compared with that of a symmetrically parallel-combined amplifier, such as a hybrid combined amplifier.

An operation of the Doherty amplifier shown in FIG. 1 will now be described below.

An output network including combining units, i.e., the transformers 107 and 109, of the Doherty amplifier is implemented by connecting a transmission line 107 with a characteristic impedance Zo and a length λ/4 to an output of the carrier amplifier 103 and connecting a Zo/√2 load 109 to a rear end of the transmission line 107. An output end of the peaking amplifier 105 is connected to a contact point between the transmission line 107 and the Zo/√2 load 109. If low input power is applied to this structure, the peaking amplifier 105 is turned OFF, so load impedance seen at the carrier amplifier 103 doubles to 2·Zo. However, if high input power is applied to the Doherty amplifier, the peaking amplifier 105 is turned ON, so impedance after the λ/4 transmission line becomes Zo due to an output current of the peaking amplifier 105. As a result, impedance seen at the carrier amplifier 103 becomes Zo, and the Doherty amplifier is driven at its maximum output power.

The phenomenon in which impedance seen at the carrier amplifier 103 changes, i.e., gain or output power suffers change, is called "load modulation". The Doherty amplifier, compared with the hybrid combined amplifier, increases in efficiency due to the load modulation operation.

If the conventional Doherty amplifier receives the low input power as described above, the carrier amplifier 103 doubles in gain due to the load modulation operation. As a result, the total gain remains unchanged even though the peaking amplifier 105 operates.

However, unlike an ideal Doherty amplifier the conventional actual used Doherty amplifier suffers power leakage toward the peaking amplifier 105. Therefore, its actual gain decreases due to the leaked power, the imperfect load modulation operation and an insertion loss of the divider 101.

In addition, the conventional Doherty amplifier further suffers linearity degradation due to non-linear operation of the peaking amplifier 105. Moreover, the Doherty amplifier cannot be designed such that the peaking amplifier 105 is correctly turned ON/OFF according to a power level, making it impossible to acquire its expected efficiency.

Accordingly, there is a need for an improved Doherty amplifier design scheme capable of increasing gain and linearity by solving the problems of the conventional Doherty amplifier.

SUMMARY OF THE INVENTION

It is, therefore, an object of the present invention to provide a Doherty amplifier design scheme for improving gain and linearity of a power amplification apparatus in a wireless communication system.

It is another object of the present invention to provide a Doherty amplifier design scheme capable of increasing gain and linearity of a Doherty amplifier by improving the low power input characteristics of the conventional Doherty amplifier.

It is further another object of the present invention to provide a scheme for designing a Doherty amplifier whose gain and efficiency characteristics maximally approach those of an ideal Doherty amplifier by turning ON/OFF a peaking amplifier in the Doherty amplifier according to a power level.

It is yet another object of the present invention to provide a scheme capable of improving gain and linearity and maintaining unique characteristics of a Doherty amplifier by preventing an insertion loss caused by a divider and power leakage caused by a combiner resulting from low input power in the Doherty amplifier.

It is still another object of the present invention to provide a Doherty amplifier capable of improving its total gain and linearity by blocking input/output of a peaking amplifier and connecting only a carrier amplifier to a main path through a radio frequency (RF) switch upon receiving low input power.

According to one aspect of the present invention, there is provided a power amplification apparatus using in a wireless communication. The apparatus includes a carrier amplifier; a peaking amplifier; a detection and comparison controller for detecting an envelope signal from a predetermined input signal, comparing a value of the envelope signal with a predetermined threshold, and generating a control signal corresponding to a threshold power; and at least one switch for turning on and off the peaking amplifier according to the control signal.

According to another aspect of the present invention, there is provided a method for controlling power of a power amplification apparatus including a carrier amplifier and a peaking amplifier in a wireless communication system. The method includes, detecting an envelope signal from a predetermined input power; comparing a value of the envelope signal with a predetermined threshold, and generating a control signal corresponding to a threshold power; and controlling a switching operation according to the control signal.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will now be described in detail with reference to the annexed drawings. In the following description, a detailed description of known functions and configurations incorporated herein has been omitted for clarity and conciseness.

The present invention proposes a Doherty-type amplifier applied to a wireless communication system. In particular, the present invention proposes an apparatus and method for improving low power input characteristics of a general Doherty amplifier. To this end, an embodiment of the present invention proposes a Doherty-type amplifier design scheme capable of improving gain and linearity of a Doherty amplifier using a predetermined switch in the Doherty amplifier and a power control method for the Doherty amplifier.

A Doherty-type amplifier of the present invention is designed such that it may include a switch. The embodiment can provide unique characteristics, such as gain and efficiency, of a Doherty amplifier through prevention of an insertion loss caused by a divider and power leakage caused by an output network including combining units, i.e., transformers, through operation of the switch.

In addition, an embodiment of the present invention proposes a scheme for designing a Doherty-type amplifier whose characteristics approach those of an ideal Doherty amplifier by turning ON/OFF a peaking amplifier in the Doherty amplifier according to a power level. This embodiment allows low input power not to pass through a 3-dB coupler used for a divider, through operation of a radio frequency (RF) switch upon receiving the low input power at which the peaking amplifier does not operate, and connects only the carrier amplifier to a main path by blocking input/output of the peaking amplifier.

In other words, at low input power, the embodiment of the present invention allows the input power to bypass the divider using the switch, and to be applied only to the carrier amplifier. However, at high input power, the embodiment allows the input power to pass through the divider using the switch so that the input power may be applied to both the carrier amplifier and the peaking amplifier.

In this manner, the Doherty-type amplifier of the present invention can prevent the peaking amplifier, when OFF, from connecting with a line through a switching operation, thereby improving gain and linearity of the entire amplifier.

An embodiment of a Doherty-type amplifier of the present invention will now be described with reference to the accompanying drawings.

Figure 1:
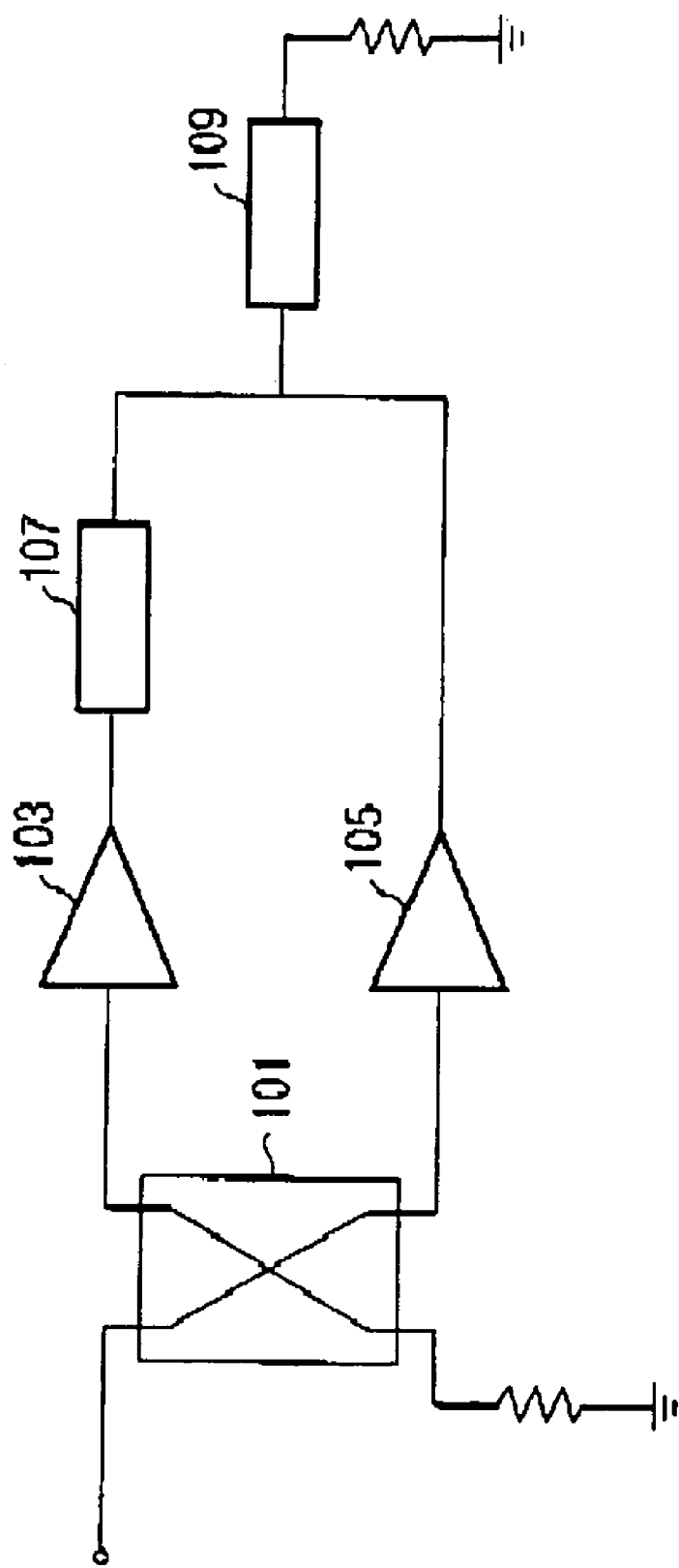
FIG. 1 is a block diagram schematically illustrating a structure of a Doherty amplifier applied to a general wireless communication system.
Figure 2:
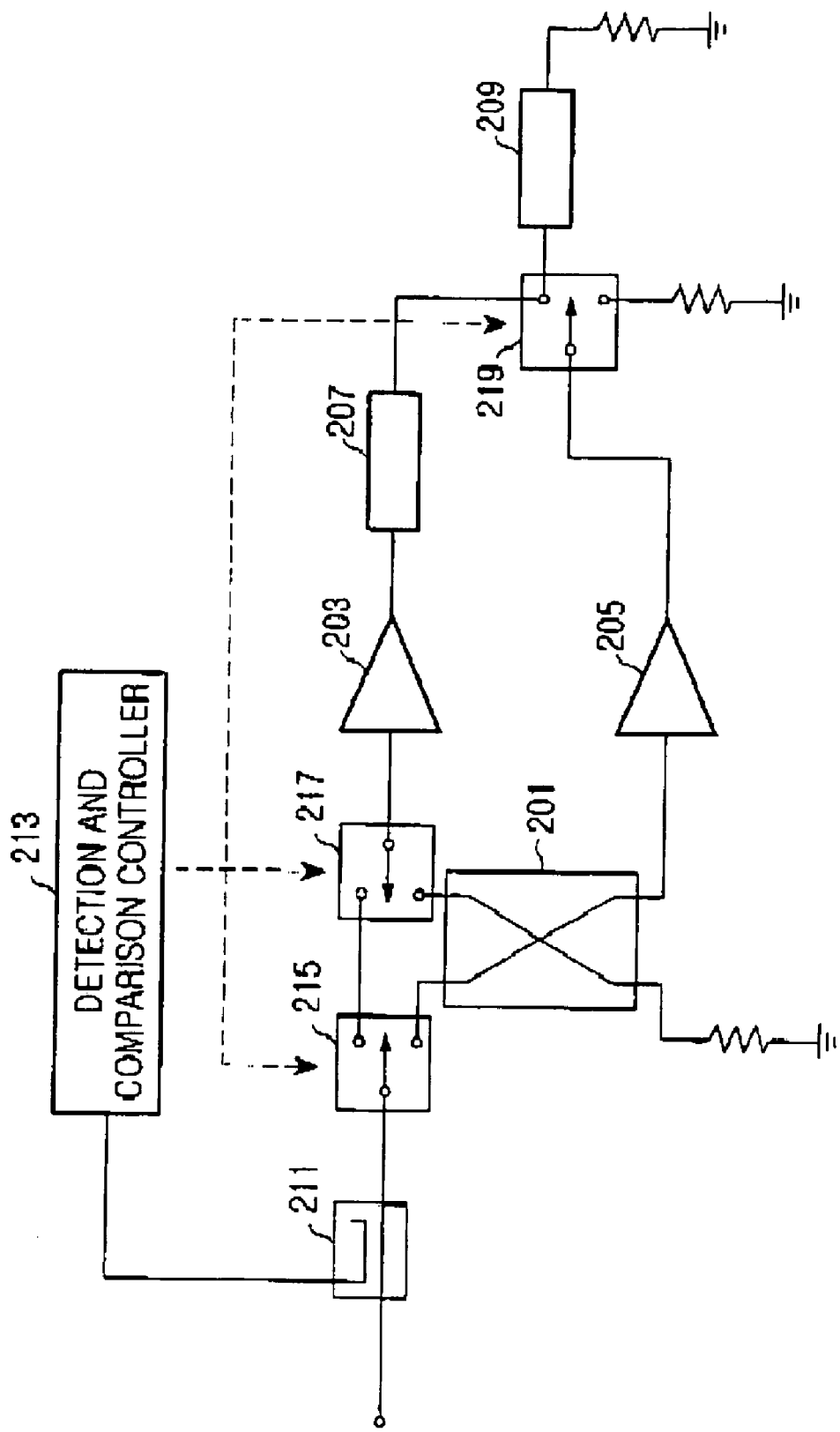
FIG. 2 is a block diagram illustrating a structure of a Doherty-type amplifier according to an embodiment of the present invention.

FIG. 2 is a block diagram illustrating a structure of a Doherty-type amplifier according to an embodiment of the present invention.

Referring to FIG. 2, a Doherty-type amplifier according to an embodiment of the present invention includes a divider 201, a carrier amplifier 203, a peaking amplifier 205, transformers 207 and 209, a coupler 211, a detection and comparison controller 213, and one or more switches such as first through third switches 215, 217 and 219. In addition to a structure of the conventional Doherty amplifier, a structure of the novel Doherty-type amplifier of the present invention includes the first through third switches 215, 217 and 219 for switching an RF line, the coupler 211 for distinguishing between a low power input and a high power input by detecting an RF input signal, and the detection and comparison controller 213 in which an envelope detector for detecting an envelope signal from a particular input signal is combined with a comparator for comparing the detected value with a predetermined threshold.

Further, the novel Doherty-type amplifier includes the carrier amplifier 203 and peaking amplifier 205 for amplifying input power divided through the divider 201 and the λ/4-impedance transformer 207 for converting load impedance of the carrier amplifier 203 according to an output of the peaking amplifier 205, and a transmission line for compensating for a phase difference with a line of the carrier amplifier 203 at an input end of the peaking amplifier 205 substituting for its role in the divider 201.

As shown in FIG. 2, the novel Doherty-type amplifier of includes first through third switches 215, 217 and 219, and the detection and comparison controller 213.

The conventional Doherty amplifier, in which impedance seen at the carrier amplifier 205 varies according to input power, has high impedance 2·Zo at low power and low impedance Zo at high power.

Operations of varying impedance according to the input power in the conventional Doherty amplifier compared with the novel Doherty-type amplifier will now be described below.

In the conventional Doherty amplifier, when a load Zo is connected to an output end of the Doherty amplifier while the peaking amplifier 205 is turned OFF, output impedance of the carrier amplifier 203 changes to Zo/2 by the transformer 209 having characteristic impedance Zo/$\sqrt{2}$. Thereafter, the impedance becomes characteristic impedance Zo located at an output end of the carrier amplifier 203, and the load impedance seen at the carrier amplifier 203 becomes 2·Zo by the λ/4-impedance transformer 207.

If the input power increases, turning ON the peaking amplifier 205, output impedance of the peaking amplifier 205 increases from Zo/2 to Zo. At this time, impedance seen at the carrier amplifier 203 reduces from 2·Zo to Zo.

However, the novel Doherty-type amplifier of the present invention distinguishes between a low power input and a high power input when the peaking amplifier 205 is turned OFF, in order to correct a reduction in gain by the divider 201 and a reduction in gain and linearity by the power leaking from the combining units toward the peaking amplifier 205.

That is, the present invention enables the Doherty-type amplifier to detect a point where the peaking amplifier 205 operates according to measured data, i.e., a boundary where low power is distinguished from high power. Preferably, a predetermined threshold is set for controlling an operation of the peaking amplifier 205 for either one or both of the coupler 211 and the detection and comparison controller 213, and the switches are controlled according to the set threshold.

The detection and comparison controller 213 includes an envelope detector and a comparator, and a control circuit for generating a control signal used for performing a switching operation on the switches 215, 217 and 219. A description will now be made as to the operation of the detection and comparison controller 213 depending on input power.

If input power is applied to the detection and comparison controller 213, the envelope detector in the detection and comparison controller 213 detects the input power, and the comparator in the detection and comparison controller 213 compares the value detected by the envelope detector with a preset threshold and outputs a switching value for the switch control operation according to the comparison result. For example, if the detected input value $V_{in}$ is greater than or equal to the threshold $V_{th}$ ($V_{in} \geq V_{th}$) as a result of the comparison, the comparator sets the output value, i.e., the switching value for the switch control operation, to '+1'. However, if the detected input value $V_{in}$ is less than the threshold $V_{th}$ ($V_{in} < V_{th}$), the comparator sets the output value, i.e., the switching value for the switch control operation, to '−1'. Thereafter, the detection and comparison controller 213 controls the switching operation using the output value '+1' or '−1'. Such a switching operation will be described below in more detail with reference to FIGS. 3A and 3B.

In some cases, the switches cannot adjust to a variation rate of the envelope because the signal uses a high peak-to-average power ratio (PAPR). Therefore, in this case, a low-pass filter (LPF) is preferably included in the detection and comparison controller 213 so that it may use an averaged power level for the comparison operation.

Figure 3A:
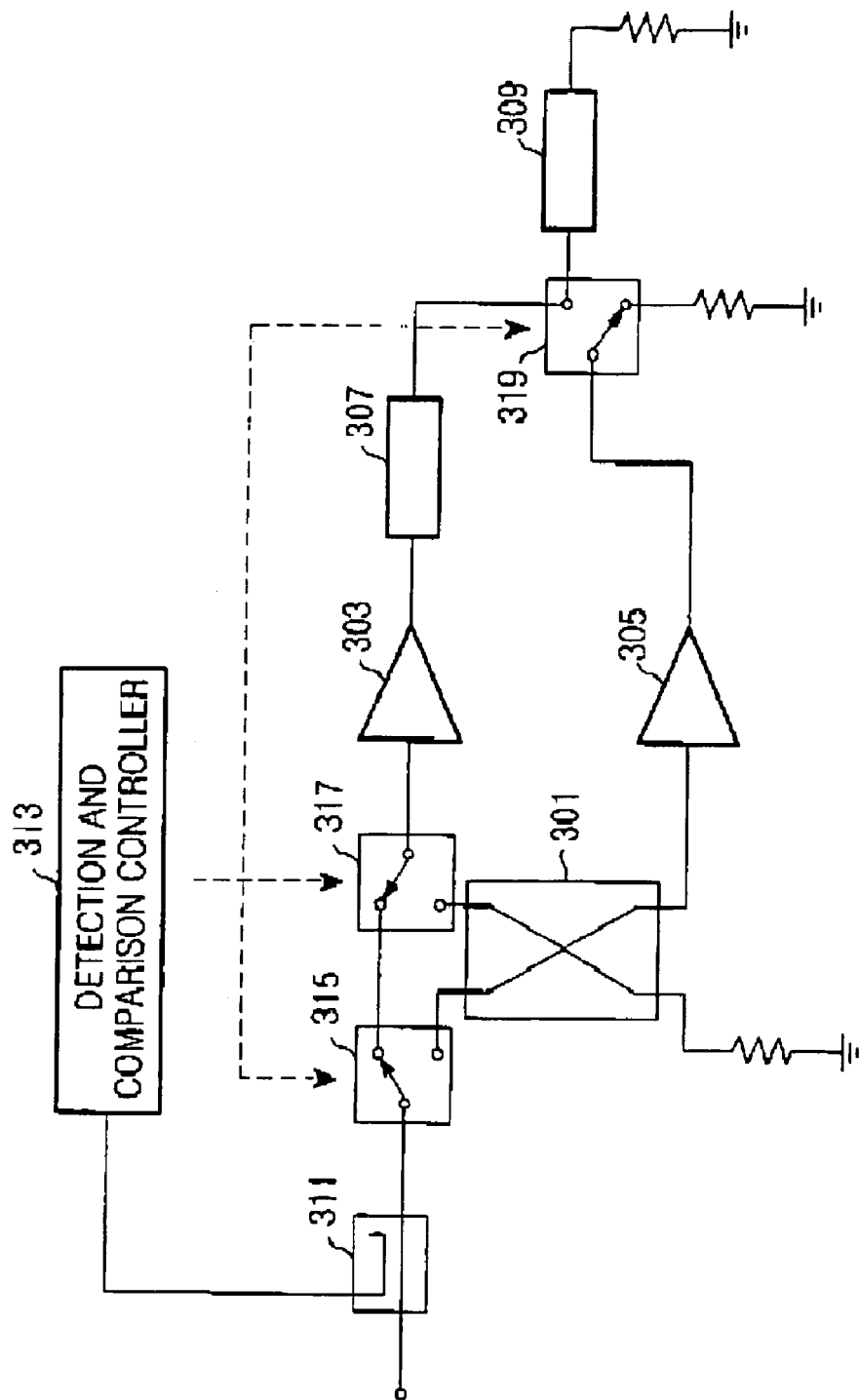
FIGS. 3A and 3B are block diagrams for a description of an operation of a Doherty-type amplifier according to an embodiment of the present invention.
Figure 3B:
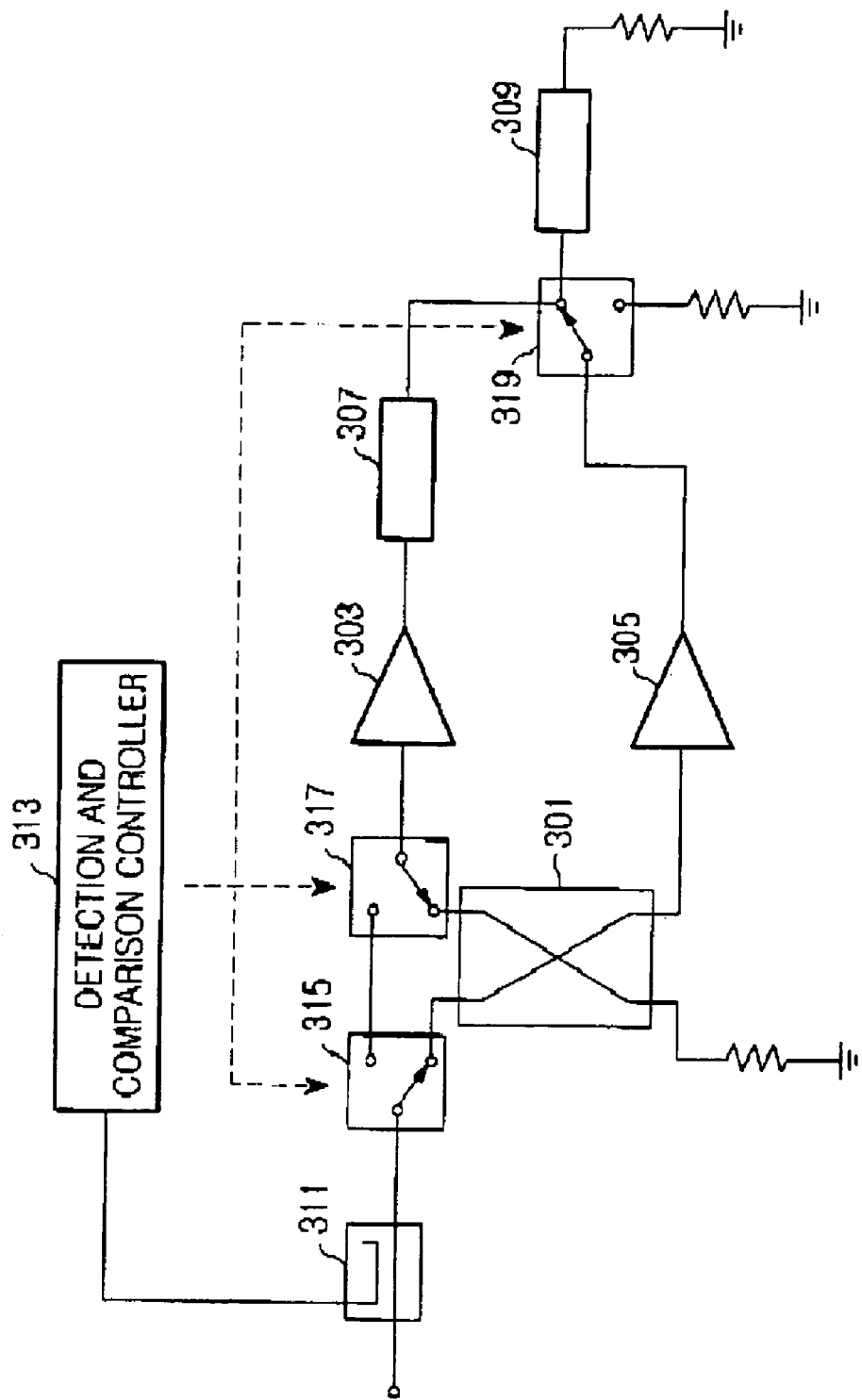

FIGS. 3A and 3B are block diagrams of an operation of the Doherty-type amplifier of the present invention.

FIG. 3A is a block diagram illustrating an operation of the Doherty-type amplifier for a low input power level. If input power is applied to the Doherty-type amplifier, a coupler 311 checks an operation point of a peaking amplifier 305, i.e., checks a boundary between low power and high power, for the input power, and then transmits the input power.

A detection and comparison controller 313 detects an envelope signal from the input power, and compares the detected value with a predetermined threshold. Subsequently, the detection and comparison controller 313 transmits a control signal corresponding to the comparison result to first through third switches 315, 317 and 319, to control a switching operation. If the control signal, i.e., an output value of the detection and comparison controller 313, is set to, for example, '−1' indicating low input power, the detection and comparison controller 313 disconnects a line for, and turns OFF, the peaking amplifier 305.

The first and second switches 315 and 317 perform a switching operation for connecting a line to each other, and the third switch 319 performs a switching operation for disconnection from an output end of the Doherty-type amplifier.

The novel Doherty-type amplifier performs the switching operation for low input power such that output impedance of the peaking amplifier 305 becomes a value sufficient for terminating an output end of the peaking amplifier 305, for example, 50Ω, leaving only the output of the carrier amplifier 303 connected to the load.

Next, FIG. 3B is a block diagram illustrating an operation of the Doherty-type amplifier for a high input power level. When input power is applied to the Doherty-type amplifier, the coupler 311 checks an operation point of the peaking amplifier 305, i.e., checks a boundary between low power and high power, for the input power, and then transmits the input power.

The detection and comparison controller 313 detects an envelope signal from the input power, and compares the detected value with a predetermined threshold. Subsequently, the detection and comparison controller 313 transmits a control signal corresponding to the comparison result to the first through third switches 315, 317 and 319, to control a switching operation. If the control signal, i.e., an output value of the detection and comparison controller 313, is set to, for example, '+1' indicating high input power, the detection and comparison controller 313 connects a line for, and turns ON, the peaking amplifier 305.

The first and second switches 315, 317 perform a switching operation for line connection to the divider 301 for signal transmission to the peaking amplifier 305, the second switch 317 performs a switching operation for line connection to the divider 301 for an operation of the Doherty-type amplifier, and the third switch 319 performs a switching operation for line connection with an output end of the Doherty-type amplifier.

The novel Doherty-type amplifier enables only the carrier amplifier for low input power. However, for high input power, the novel Doherty-type amplifier operates in the same manner as the conventional Doherty amplifier.

Figure 4:
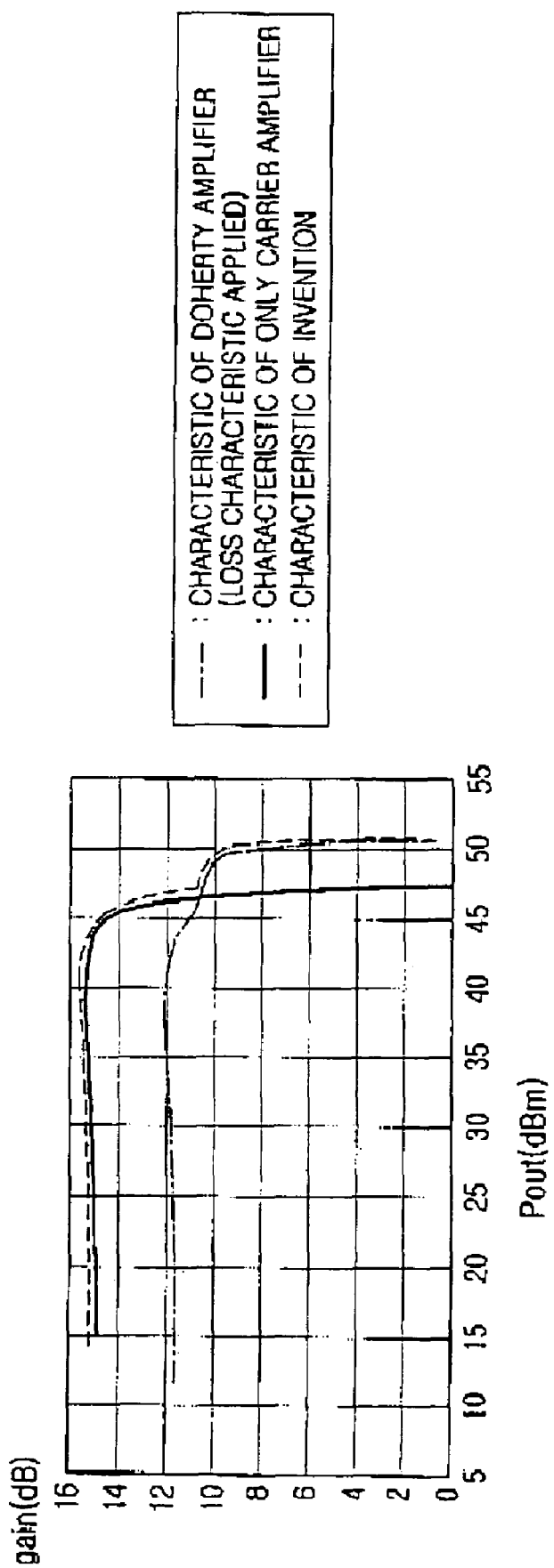
FIG. 4 is a diagram illustrating gain characteristics of a Doherty-type amplifier according to an embodiment of the present invention.
Figure 5:
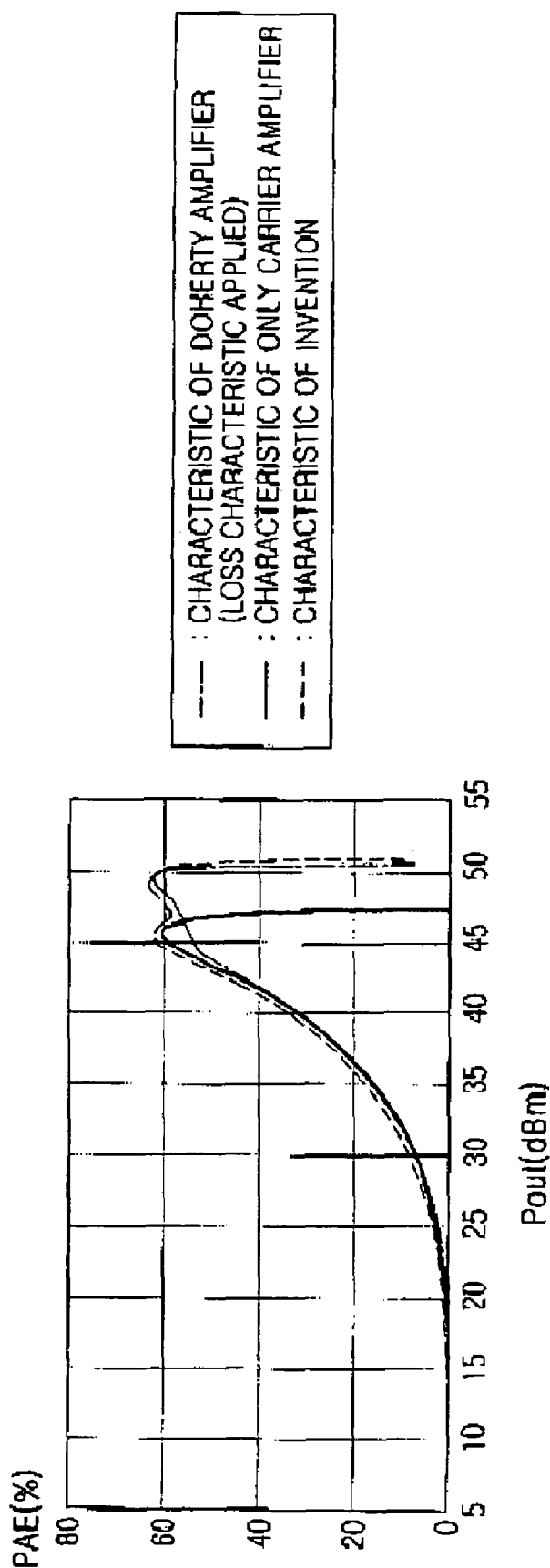
FIG. 5 is a diagram illustrating efficiency characteristics of a Doherty-type amplifier according to an embodiment of the present invention.
Figure 6:
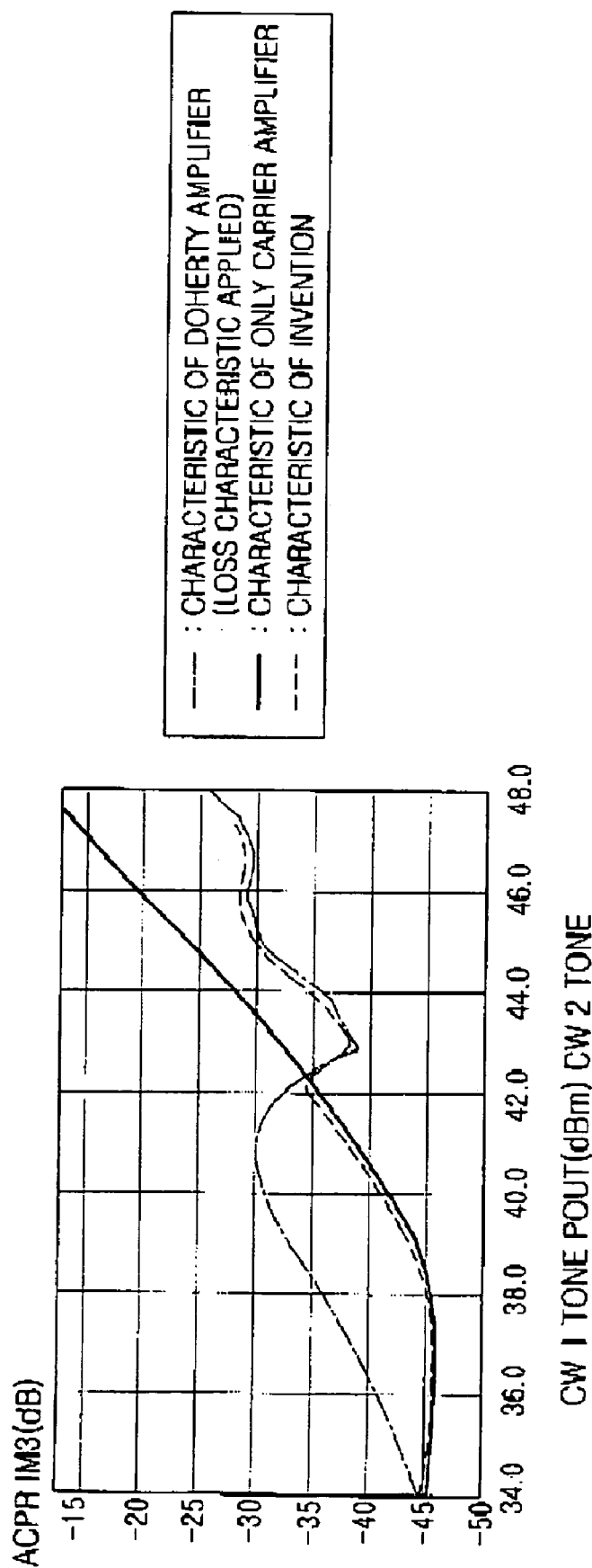
FIG. 6 is a diagram illustrating linearity characteristics of a Doherty-type amplifier according to an embodiment of the present invention.

With reference to FIGS. 4 through 6, a description will now be made of performance of the Doherty-type amplifier according to the present invention.

FIG. 4 is a diagram illustrating gain characteristics of a Doherty-type amplifier according to an embodiment of the present invention. FIG. 4 is a graph illustrating a variation in gain with respect to output power of the Doherty-type amplifier in the cases where only the carrier amplifier operates and where the Doherty-type amplifier operates as a conventional Doherty amplifier. Referring to FIG. 4, the Doherty-type amplifier enables only the carrier amplifier for low input power, and operates as a conventional Doherty amplifier for high input power. That is, the Doherty-type amplifier enables only the carrier amplifier from a low input power level through a critical point for load modulation, and operates as a conventional Doherty amplifier from the critical point, thus improving the overall gain. As evident from FIG. 4, the novel Doherty-type amplifier shows gain improvement of about 3 dB for the low input power.

FIG. 5 is a diagram illustrating efficiency characteristics of a Doherty-type amplifier according to an embodiment of the present invention.

FIG. 5 is a graph illustrating a variation in power added efficiency (PAE) with respect to output power of the Doherty-type amplifier of the present invention, in the cases where only the carrier amplifier operates and where the Doherty-type amplifier operates as a conventional Doherty amplifier. Referring to FIG. 5, the Doherty-type amplifier enables only the carrier amplifier for low input power, and operates as a conventional Doherty amplifier for high input power. That is, it can be noted from FIG. 5 that the characteristic that the peaking amplifier does not operate for the low input power is already reflected in the conventional Doherty amplifier.

FIG. 6 is a diagram illustrating linearity characteristics of a Doherty-type amplifier according to an embodiment of the present invention.

FIG. 6 is a graph illustrating a variation in linearity with respect to output power of the Doherty-type amplifier of the present invention, in the cases where only the carrier amplifier operates and where the Doherty-type amplifier operates as a conventional Doherty amplifier. As evident in FIG. 6, the proposed Doherty-type amplifier shows improvement of 5 dB~10 dB with respect to linearity.

Herein, an inter-modulation distortion (IMD) characteristic is used as a criterion for the linearity decision. The term "IMD" refers to a distortion signal caused by inter-modulation, or a level of the distortion signal. Since a third IMD is generally the most fatal, the term "IMD" refers to the third IMD. In addition, an adjacent channel power ratio (ACPR) represents a linearity standard for the power amplifier.

Furthermore, the lower-level IMD signal is preferred. As a measured IMD value decreases, a self-noise component like the third IMD becomes lower in level than the source signal, indicating an increase in the linearity. Therefore, by optimizing a linear region of the Doherty-type amplifier and the carrier amplifier in the Doherty-type amplifier, a reduction in interference with adjacent channels is achieved, thus contributing to a significant increase in gain, and ultimately, an increase in user capacity, in terms of system operation.

As can be understood from the foregoing description, a proposed power amplification apparatus and method using a switching structure in a wireless communication system can prevent an insertion loss caused by a divider and power leakage at an output end when low power is input to the Doherty amplifier. The prevention of the insertion loss and power leakage can contribute to an improvement in gain and linearity of the Doherty amplifier, thereby maintaining the unique characteristics (gain and efficiency) of the Doherty amplifier.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A power amplification apparatus in a wireless communication system, comprising:
   a carrier amplifier;
   a peaking amplifier;
   a detection and comparison controller for detecting an envelope signal from a predetermined input signal, comparing a value of the envelope signal with a predetermined threshold, and generating a control signal corresponding to a threshold power;
   at least one switch for turning on and off the peaking amplifier according to the control signal; and
   a switch for connecting between the peaking amplifier and a transformer, according to the control signal.

2. The power amplification apparatus of claim 1, wherein the detection and comparison controller comprises:
   an envelope detector for detecting the envelope signal; and
   a comparator for comparing the value with the preset threshold and generating a control signal according to a comparison result.

3. The power amplification apparatus of claim 1, wherein the transformer converts load impedance of the carrier amplifier according to an output of the peaking amplifier.

4. The power amplification apparatus of claim 1, further comprising a divider for performing a transmission line function for compensating for a phase difference with a line of the carrier amplifier at an input end of the peaking amplifier.

5. The power amplification apparatus of claim 1, wherein the power amplification apparatus operates as a single-ended amplifier at input power less than the threshold power, and operates as a Doherty amplifier at input power greater than the threshold power.

6. The power amplification apparatus of claim 1, wherein at input power less than the threshold power, the detection and comparison controller controls the at least one switch such that the input power bypasses a divider and is applied exclusively to the carrier amplifier.

7. The power amplification apparatus of claim 1, wherein at input power greater than the threshold power, the detection and comparison controller controls the at least one switch such that the input power passes through a divider and is applied to both the carrier amplifier and the peaking amplifier.

8. The power amplification apparatus of claim 1, wherein at input power less than the threshold power, the detection and comparison controller generates a control signal for exclusively connecting an output of the carrier amplifier to a load.

9. The power amplification apparatus of claim 1, wherein at input power greater than the threshold power, the detection and comparison controller generates a control signal for Doherty-combining the peaking amplifier and the carrier amplifier.

10. The power amplification apparatus of claim 1, wherein the detection and comparison controller further comprises a low-pass filter for averaged power level comparison.

11. A method for controlling power of a power amplification apparatus including a carrier amplifier and a peaking amplifier in a wireless communication system, the method comprising the steps of:
  detecting an envelope signal from a predetermined input power;
  comparing a value of the envelope signal with a predetermined threshold, and generating a control signal corresponding to a threshold power; and
  switching at least one switch for turning on or off the peaking amplifier, and switching a switch for connecting between the peaking amplifier and a transformer, according to the control signal.

12. The method of claim 11, wherein the step of detecting an envelope signal comprises the step of detecting the input power to detect a boundary between low power and high power.

13. The method of claim 11, wherein the step of controlling a switching operation comprises the step of disconnecting a line of the peaking amplifier according to a control signal corresponding to a low power input.

14. The method of claim 11, wherein the step of controlling a switching operation comprises the step of connecting a line of the peaking amplifier according to a control signal corresponding to a high power input.

15. The method of claim 11, wherein the step of controlling a switching operation comprises the step of allowing the power amplification apparatus to operate as a single-ended amplifier when the input power is less than the threshold power, and allowing the power amplification apparatus to operate as a Doherty amplifier when the input power is greater than the threshold power.

16. The method of claim 11, wherein the step of controlling a switching operation comprises the steps of:
  exclusively enabling the carrier amplifier when the input power is less than the threshold power; and
  allowing the power amplification apparatus to operate as a Doherty amplifier when the input power is greater than the threshold power.

17. The method of claim 11, wherein the step of controlling a switching operation comprises the step of bypassing the input power from a divider and applying the input power exclusively to the carrier amplifier when the input power is less than the threshold power.

18. The method of claim 11, wherein the step of controlling a switching operation comprises the step of applying the input power through a divider to the carrier amplifier and the peaking amplifier when the input power is greater than the threshold power.

19. The method of claim 11, wherein the step of controlling a switching operation comprises the step of connecting an output of the carrier amplifier to a load according to the control signal when the input power is less than the threshold power.

20. The method of claim 11, wherein the step of controlling a switching operation comprises the step of Doherty-combining the peaking amplifier and the carrier amplifier according to the control signal when the input power is greater than the threshold power.

* * * * *